United States Patent [19]
Segawa

[11] Patent Number: 4,875,193
[45] Date of Patent: Oct. 17, 1989

[54] SEMICONDUCTOR MEMORY WITH IMPROVED CELL ARRANGEMENT

[75] Inventor: Machio Segawa, Tokyo, Japan

[73] Assignee: NEC Corporation, Tokyo, Japan

[21] Appl. No.: 138,482

[22] Filed: Dec. 28, 1987

[30] Foreign Application Priority Data

Dec. 25, 1986 [JP] Japan .................................. 61-309763

[51] Int. Cl.$^4$ ............................................ G11C 13/00
[52] U.S. Cl. ................................... 365/207; 365/210; 365/222
[58] Field of Search ............... 365/207, 189, 210, 205, 365/222

[56] References Cited

U.S. PATENT DOCUMENTS 4,367,540  1/1983  Shimohigashi ..................... 365/207

Primary Examiner—Joseph A. Popek
Attorney, Agent, or Firm—Sughrue, Mion, Zinn, Macpeak & Seas

[57] ABSTRACT

A dynamic type semiconductor memory having an improved operation speed and operable by a small power consumption is disclosed. The memory cell includes a pair of bit lines which are divided into a plurality of sections, a plurality of first amplifiers provided for the sections, a second amplifier provided for the pair of bit lines. The first sense amplifier amplifies the signal at the relevant section and the second amplifier amplifies the signal from the first sense amplifier to drive a bus lines.

6 Claims, 6 Drawing Sheets

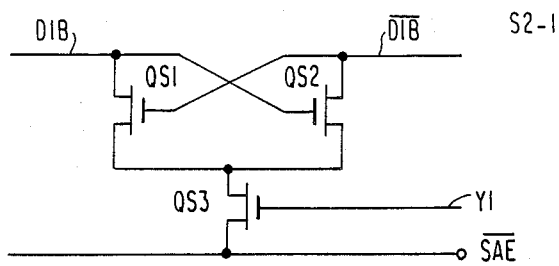
FIG. 6
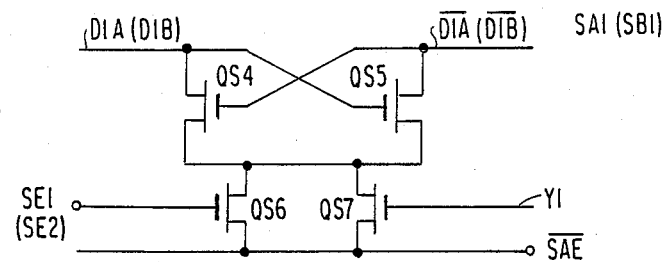
FIG. 7
FIG. 8
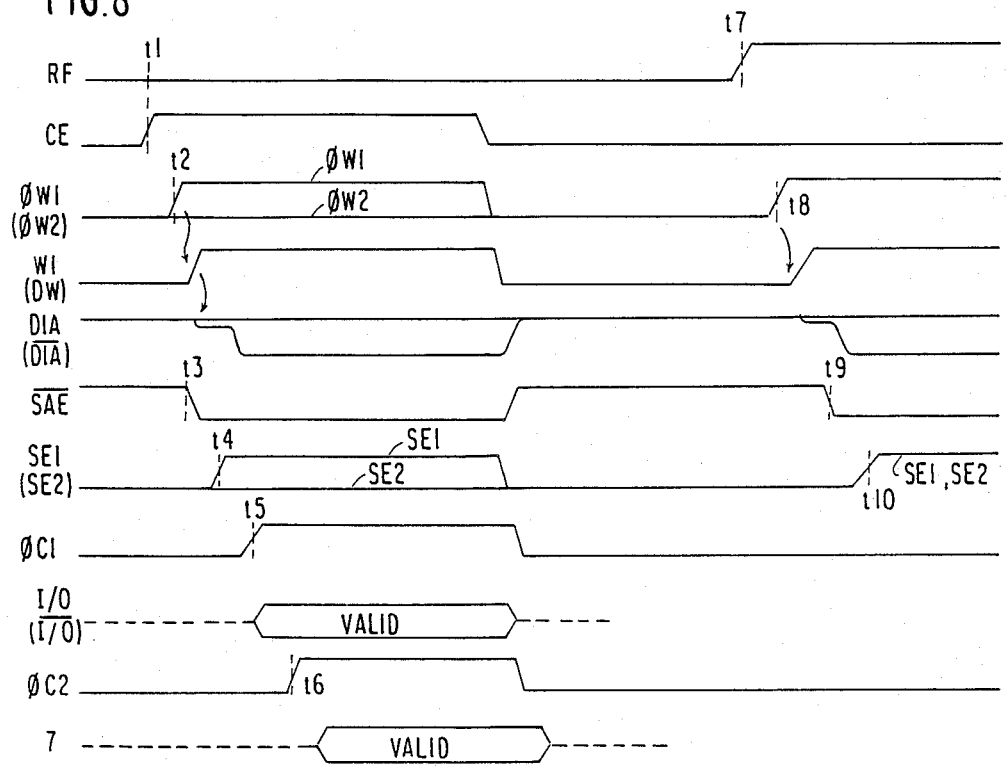

SEMICONDUCTOR MEMORY WITH IMPROVED CELL ARRANGEMENT

BACKGROUND OF THE INVENTION

The present invention relates to a semiconductor memory and more particularly to a dynamic type semiconductor memory device.

Dynamic type memories have been widely utilized in variety of fields as large capacity memories.

Typical structure of a dynamic memory is such that a plurality of dynamic memory cells are arranged in rows and columns with word lines in rows and a plurality pairs of bit lines in columns. A sense amplifier is disposed at one end of a pair of bit lines and connected thereto. Upon selection of one of word lines, a memory cell connected to the selected word line produces a stored signal to one of the pair of bit lines connected thereto. The sense amplifier operatively amplifies a difference in potentials between the above pair of bit lines. Then, a selected one of the sense amplifiers is electrically connected to a pair of bus lines via a selected pair of column switch transistors thereby to transfer the amplified read signal to the pair of bus lines.

The above-described type of conventional semiconductor memory device suffers, however, from the problem that, if it is intended to increase the integration density, the number of memory cells which are connected to each bit line increases, which causes an increase in the length of the bit line, resulting in an increase in the parasitic capacitance and hence a lowering in the level of sensitivity of the sense amplifier.

To cope with the above-described problem, a method wherein each bit line pair is divided into a multiplicity of sections to thereby reduce the parasitic capacitance has been proposed. However, if the bit line pair is divided into a multiplicity of sections, it is necessary to increase the number of column switch transistors which are required to connect the sections to the bus lines, and an increase in the number of column switch transistors causes an increase in the parasitic capacitance of the bus lines. For this reason, all the sense amplifiers are required not only to amplify the difference in potentials between the respective pairs of bit lines but also to further amplify the read signal in order to drive the bus lines, and it is also necessary to increase the number of sense amplifiers in accordance with the division of each bit line pair into a multiplicity of sections, which results, disadvantageously, in a substantial increase in the power consumption.

Furthermore, due to the large capacitance of the bus lines, it is difficult to drive the bus lines by the selected sense amplifier at a high speed.

SUMMARY OF THE INVENTION

It is an object of the present invention to provide a dynamic memory operable by a reduced amount of power consumption.

It is another object of the present invention to provide a dynamic memory operable at a high speed.

The dynamic memory according to the present invention is featured in that a pair of bit lines in each column are divided into a plurality pairs of sub-bit lines with a plurality of first sense amplifiers each electrically connected to each pair of sub-bit lines and a second sense amplifier is provided for each column to amplify the output of a selected one of the first sense amplifiers and drive a pair of bus lines. Among the plurality of first sense amplifiers, one associated to the pair of sub-bit lines connected to a selected memory cell is enabled while the remaining first sense amplifiers in each column remain disenabled.

According to the present invention, the first sense amplifier is simply required amplify a signal difference of the associated pair of sub-bit lines having small capacitances. Therefore, the signal difference on the pair of sub-bit lines can be rapidly amplified. Further, the first sense amplifier connected to the pair of sub-bit lines is enabled with others unenabled. Therefore, the power consumption is also reduced.

According to one aspect of the present invention, there is provided a semiconductor memory device comprising: a plurality of bit line pairs each composed of a plurality of sections; a plurality of memory cells connected to each of the sections; a first sense amplifier provided in correspondence with each section to amplify a voltage difference between a voltage corresponding to information read out from a selected memory cell and a reference voltage; switch transistors provided between each pair of adjacent sections to electrically connect that section of the bit line pair to which a selected memory cell is connected to a section which is adjacent thereto; a second sense amplifier provided in correspondence with each bit line pair to amplify a voltage difference between the bit line pair to which a selected memory cell is connected; and column switch transistors provided between each second sense amplifier and bus lines to transfer the voltage difference amplified by the second sense amplifier to the bus lines.

According to the above aspect, each bit line pair is divided into a plurality of sections, and a first sense amplifier for differentially amplifying signals read out from memory cells is disposed between each pair of adjacent sections, and further, a second sense amplifier which is in charge of amplification required to transfer data to bus lines is disposed at either one or the other of two ends of the bit line pair. The first sense amplifier is controlled by either a sense amplifier select signal or a select signal from a column decoder, while the second sense amplifier is controlled by the select signal from the column decoder. Accordingly, when information is to be read out, the following sense amplifiers alone are activated, that is, a plurality of first sense amplifiers which are selected by respective sense amplifier select signals, and the first and second sense amplifiers which are connected to a bit line pair selected by a select signal from the column decoder. Thus, an amount of electric power consumption which is required to activate only the above-described limited number of sense amplifiers is necessitated.

BRIEF DESCRIPTION OF THE DRAWINGS

FIG. 6 is a schematic circuit diagram showing a column (second) sense amplifier employed by the invention;

FIG. 7 is a schematic circuit diagram showing a sub-bit (first) sense amplifier employed by the invention; and FIG. 8 is a timing diagram showing operation of the memory of FIG. 4:

DETAILED DESCRIPTION OF THE INVENTION

Figure 1:
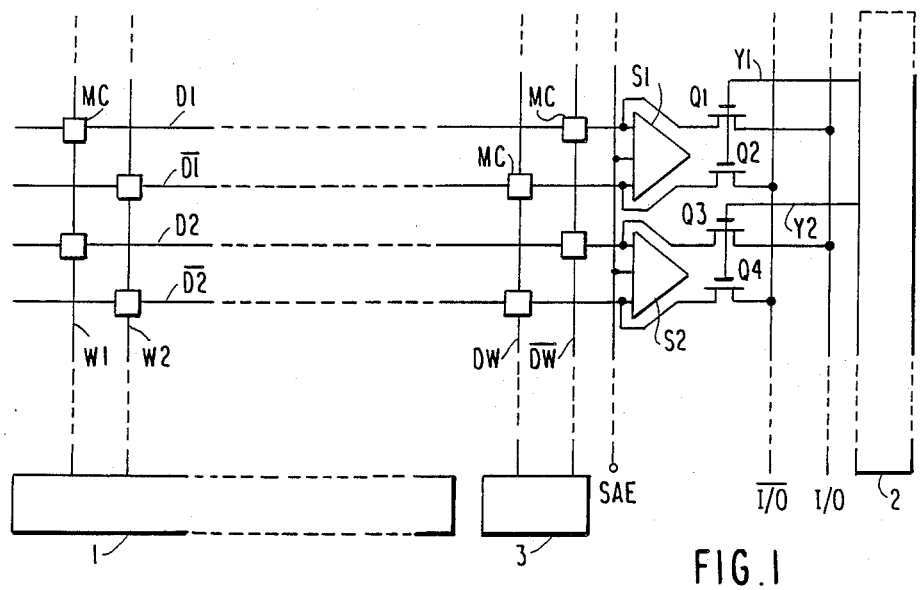
FIG. 1 is a schematic block diagram of a semiconductor memory device according to a prior art.
Figure 2:
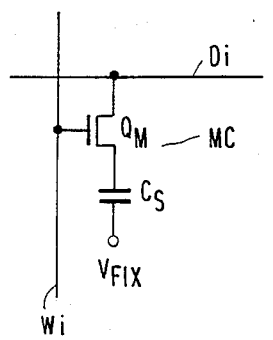
FIG. 2 is a schematic circuit diagram of a dynamic memory cell.
Figure 3:
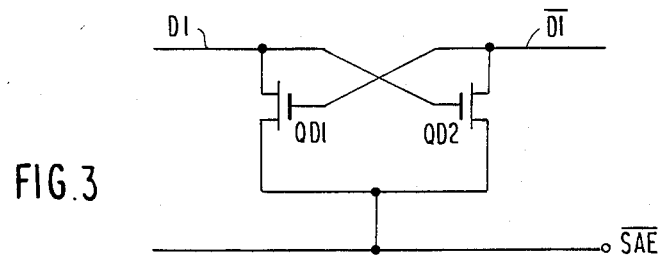
FIG. 3 is a schematic circuit diagram of a sense amplifier.

Referring to FIGS. 1 to 3, a dynamic semiconductor memory according to a prior art is explained.

In FIG. 1, two columns of arrangement is representatively illustrated.

Sense amplifiers $S_1$ and $S_2$ are provided for pairs of bit lines ($D_1$, $\overline{D_1}$; $D_2$, $\overline{D_2}$) arranged in columns, respectively. A plurality of word lines $W_1$, $W_2$ ... controlled by a row decoder 1 and a pair of dummy word lines DW, $\overline{DW}$ connected to a dummy row decoder 3. Dynamic memory cells MC are arranged in a known way. A pair of bus lines I/O and $\overline{I/O}$ are electrically connected to the pairs of bit lines ($D_1$, $\overline{D_1}$; $D_2$, $\overline{D_2}$) via pairs of column switch transistors ($Q_1$, $Q_2$; $Q_3$, $Q_4$) respectively. The pairs of column switch transistors ($Q_1$, $Q_2$; $Q_3$, $Q_4$) are controlled by column selection signals $Y_1$, $Y_2$ generated by a column decoder 2, respectively.

A structure of the memory cells MC is shown in FIG. 2. The memory cell MC includes a series connection of a memory cell transistor $Q_M$ and a storage capacitor $C_S$ connected in series between a bit line $D_i$ and a fixed potential $V_{FIX}$ with a gate of $Q_M$ connected to a word line $W_i$.

An example of the sense amplifier $S_1$ is shown in FIG. 3. The sense amplifier $S_1$ is composed of a pair of cross-coupled drive transistors $Q_{D1}$ and $Q_{D2}$ with their gates and drains and sources of the transistors $Q_{D1}$ and $Q_{D2}$ are connected to a sense enable line $\overline{SAE}$. In a read operation, one of the word lines and one of the dummy word lines, e.g. $W_1$ and DW are selected. In this case, a signal from the memory cell MC connected to the selected word line $W_1$ and a reference signal from the dummy cell connected to the dummy word line DW are read-out to the bit lines $D_1$ and $\overline{D_1}$, respectively thereby to generate a potential difference between the pair of bit lines $D_1$ and $\overline{D_1}$. Then, the enable line $\overline{SAE}$ is changed from a high (Vcc) level to a low (ground) level so that the sense amplifiers $S_1$, $S_2$ are enabled simultaneously. After the sense amplifiers enlarge the potential difference between the respective pairs of bit lines, one of the column selection signals, e.g. $Y_1$ is selected by the column decoder 2 and the switch transistors (e.g. $Q_1$ and $Q_2$) transfer the signals at the pair of bit lines (e.g. $D_1$, $\overline{D_1}$) to the pair of bus lines I/O and $\overline{I/O}$.

Accompanied by the increase in the memory capacity, the number of the memory cells coupled to each bit line is remarkably increased and therefore, the effective capacitance of the bit line is increased. Thus, a readout speed of a selected memory cell is lowered.

In order to avoid the above disadvantage, it has been proposed the technique that the number of bit line pairs is increased to reduce the number of the memory cells coupled to each bit lines. However, according to the technique, the number of switch transistors coupled between the bit lines and the bus lines so that the effective capacitances of the bus lines are adversely increased. Thus, it is difficult to drive the bus lines by the selected sense amplifier at a high speed.

A semiconductor memory device according to one embodiment of the present invention is explained with reference to FIGS. 4, 6 and 7.

Figure 4:
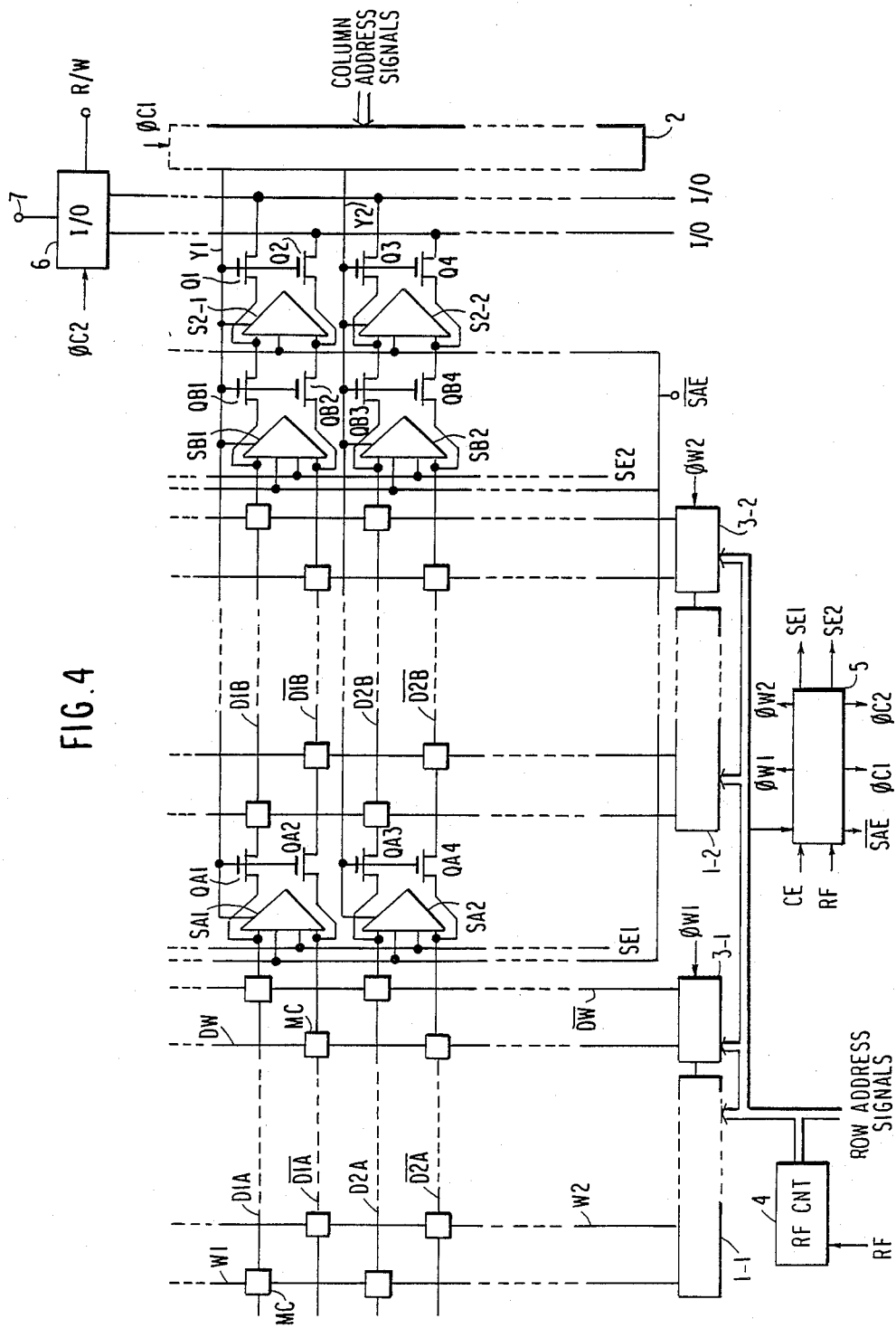
FIG. 4 is a schematic block diagram showing a dynamic memory device according to one embodiment of the present invention.

A structure of the major part of the embodiment is shown in FIG. 4. In FIG. 4, the portions or elements corresponding to those in FIG. 1 are denoted by the same references.

The respective pairs of bit lines are physically divided into two parts i.e. sub-bit lines. For example, the pair of bit lines $D_1$ and $\overline{D_1}$ in FIG. 1 are divided into a pair of sub-bit lines D1A and $\overline{D1A}$ and a pair of sub-bit lines D1B and $\overline{D1B}$. Sub-bit (first) sense amplifiers SA1 and SB1 are provided for the pair of sub-bit lines D1A, D1A and D1B, D1B, respectively. The pair of sub-bit lines D1A and $\overline{D1A}$ are electrically connected to the pair of sub-bit lines D1B and $\overline{D1B}$ via a pair of switch transistors QA1 and QA2 which is enabled by a column selection signal $Y_1$. Column (second) sense amplifiers S2-1, S2-2 are provided for columns, respectively. The pair of sub-bit lines D1B and D1B are connected to a pair of input terminals of the sense amplifier S2-1 via a pair of switch transistors $Q_{B1}$ and $Q_{B2}$ controlled by the column selection signal $Y_1$. The pair of column switch transistors $Q_1$ and $Q_2$ controlled by the column selection signal $Y_1$ electrically connect the pair of input terminals of the sense amplifier SB1 to the pair of bus lines I/O and $\overline{I/O}$, respectively. An input/output circuit 6 coupled to the pair of bus lines I/O and $\overline{I/O}$ outputs a read-out signal to an input/output terminal 7 in response to an active level of a timing signal $\phi C_2$ in a read mode designated by a high (or low) level of a read-write control signal and supplies true and complementary write signals to I/O and $\overline{I/O}$ in a write mode (a low level of R/W).

The row decoder 1 and the dummy row decoder 3 in FIG. 1 are also divided into two row decoders 1—1, 1-2 and dummy row decoders 3-1 and 3-2, respectively. The row decoder 1—1 is used to select one of the word lines intersecting with the sub-bit lines such as D1A while the row decoder 1-2 is used to select one of the word lines intersecting with the sub-bit lines such as D1B. A refresh address counter 4 generates refresh address signals to be applied to the decoders 1—1, 1-2, 3-1 and 3-2 in a refresh mode in response to a high level of a refresh signal RF. A timing signal generator 5 receives a chip enable signal CE, the refresh control signal RF and a part of the row address signals having a significance to determine which row decoder 1—1 or 1-2 actually select the word line. The timing signal generator produces an active level of word enable signal $\phi_{W1}$ or $\phi_{W2}$, a low level of sense enable signal $\overline{SAE}$, an active level of sense selection signal SE1 or SE2, a column enable signal $\phi_{C1}$ and an I/O enable signal $\phi_{C2}$, in a predetermined order. In a read or write operation, when the word line connected to the decoder 1—1 is to be selected, $\phi_{W1}$, $\overline{SAE}$, SE1, $\phi_{C1}$ and $\phi_{C2}$ are sequentially made their active levels so that the decoders 1—1 and 3-1 are enabled and thereafter the sense amplifiers SA1, SA2 are enabled.

To the contrary, when the word line connected to the decoder 1-2 is to be selected, $\phi_{W2}$, $\overline{SAE}$, SE2, $\phi_{C1}$ and $\phi_{C2}$ are sequentially made their active levels so that the decoders 1-2 and 3-2 and the sense amplifiers SB1, SB2 are enabled. In a refresh operation, both of $\phi_{W1}$ and $\phi_{W2}$ are simultaneously made active and thereafter both of SE1 and SE2 are simultaneously made active. In this case, $\phi_{C1}$ and $\phi_{C2}$ remain inactive. Therefore, both the decoders 1—1 and 1-2 select one of the word lines intersecting with the sub-bit lines D1A, D1B . . . and one of the word lines intersecting with the sub-bit lines D1B, D2B . . . simultaneously. Then, all the sense amplifiers SA1, SA2 . . . and SB1, SB2 . . . refresh the contents of the memory cells connected to the selected two word lines in response to the active level of SE1 and SE2.

An example of the column (second) sense amplifier S2-1 is shown in FIG. 6, and an example of the sub-bit (first) sense amplifiers SA1, SB1 is shown in FIG. 7. The amplifier S2-1 is enabled when a transistor QS3 is conductive in response to the active level of $Y_1$ to amplify a signal difference between D1B and $\overline{D1B}$.

The amplifier SA1 (SB1) is enabled when at least one of transistors QS6 and QS7 is conductive in response to SE1 or $Y_1$ thereby to enlarge a signal difference between D1A (D1B) and D1A ($\overline{D1B}$) through a pair of drive transistors QS4 and QS5.

Referring to FIG. 8, operation of the memory of FIG. 4 is explained.

First, a read operation is explained for the case where the word line W1 in the left-side sub-array is to be selected.

The chip enable signal CE is changed to a high active level at a time $t_1$ and then the signal $\phi_{W1}$ is raised to a high level with $\phi_{W2}$ of a low inactive level so that the decoders 1—1 and 3-1 select the word line W1 and the dummy word line DW. Thus, a small signal difference in potential is caused between the pair of sub-bit lines D1A and $\overline{D1A}$. In this instance, none of the word lines in the right-side sub-array connected to the decoders 1-2 and 3-2 is selected. Although not illustrated, between the respective pairs of sub-bit lines such as D2A, $\overline{D2A}$ in the left-side array signal differences are caused similarly. At a time $t_3$, the signal SAE is lowered to a low level and thereafter the signal SE1 is changed to a high level so that all the sense amplifiers SA1, SA2 arranged for the left-side sub-array are enabled at $t_4$ to amplify the respective signal differences between the respective pairs of sub-bit lines in the left-side sub-array. Then, at a time $t_5$, the signal $\phi_{C1}$ is made a high active level so that the column selection signal $Y_1$ is selected by the column decoder 2. Thus, in addition to the sense amplifiers SA1, SA2 . . . , the amplifiers SB1 and S2-1 in the selected colum of $Y_1$ are enabled and connected in common so that the signal difference between the pair of sub-bit lines D1A and $\overline{D1A}$ is further amplified by the sense amplifiers SB1 and S2-1 and transmitted to the bus lines I/O and $\overline{I/O}$. In this instance, the sub-bit sense amplifiers of the right-side sub-array other than SB1 and the column sense amplifiers other than S2-1 are not enabled. Then, at a time $t_6$, the signal $\phi_{C1}$ is made a high, active level so that the circuit 6 produces an output signal at the terminal 7.

It would be similarly understood for the case where the word lines of the right-side sub-array connected to the decoders 1-2 and 3-2 is to be selected.

A refresh operation is next explained. At a time $t_9$, the refresh control signal RF is made active to introduce a refresh mode to the memory. Then, at a time $t_8$, both of the signal $\phi_{W1}$ and $\phi_{W2}$ are made active so that the decoders 1—1, 1-2, 3-1 and 3-2 select one of the word lines in the left-side array and one of the word lines in the right-side array in accordance with the contents of the output of the refresh address counter 4. At a time $t_9$, the signal $\overline{SAE}$ is made low and the signals SE1 and SE2 are made active so that the all the sub-bit sense amplifiers SA1, SA2 . . . and SB1, SB2 . . . are enabled. Thus, data of the memory cells coupled to the selected two word lines are refreshed.

Figure 5:
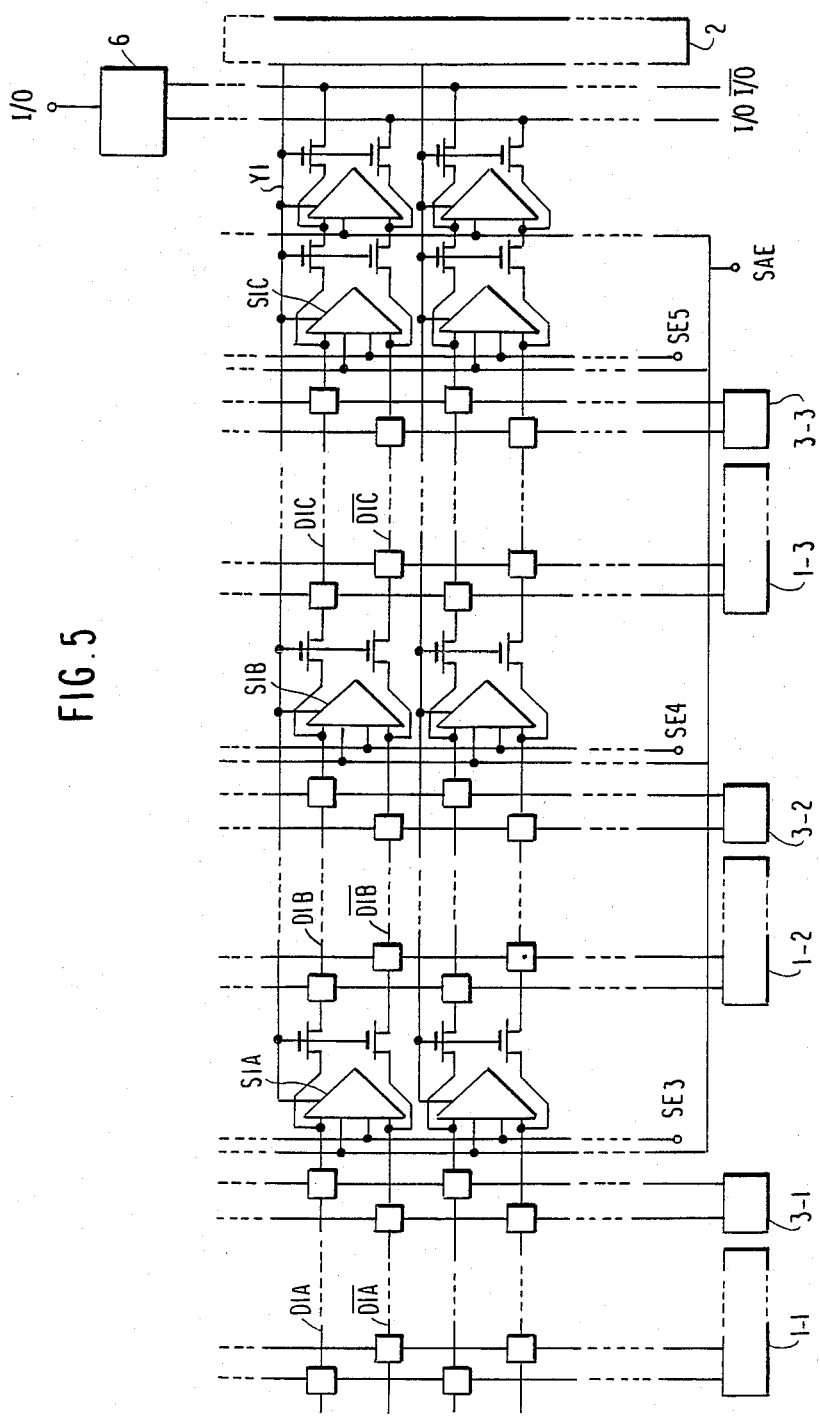
FIG. 5 is a schematic block circuit diagram showing a memory device according to a second embodiment of the present invention.

FIG. 5 shows another embodiment of the invention. This embodiment is featured that each pair of bit lines D1, $\overline{D1}$ in FIG. 1 are divided into three pairs of sub-bit lines D1A, $\overline{D1A}$; D1B, $\overline{D1B}$; and D1C, $\overline{D1C}$, and the sub-bit sense amplifiers S1A, S1B and S1C are provided for the three pairs of sub-bit lines in the column of $Y_1$.

As has been described above, the effective capacitance of the sub-bit line is greatly reduced and a high-speed sensing is achieved. Further, only a part of the amplifiers are enabled and the reduction in the power consumption is also achieved.

I claim:

1. A semiconductor memory device comprising:
a pair of bit lines, said pair of bit lines being divided into a first pair of sub-bit lines and a second pair of sub-bit lines, first memory cells coupled to said first pair of sub-bit lines, second memory cells coupled to said second pair of sub-bit lines, first word lines intersecting with said first pair of sub-bit lines and coupled only to said first memory cells, second word lines intersecting with said second pair of sub-bit lines and coupled only to said second memory cells, a first sense amplifier having a pair of input terminals connected to said first pair of sub-bit lines, a second sense amplifier having a pair of input terminals connected to said second pair of sub-bit lines, means for selecting one of said first and second word lines,
a pair of bus lines, a pair of first switches coupled between said first pair of sub-bit lines and said second pair of sub-bit lines to control an electrical connection between said first and second pairs of sub-bit lines, a third sense amplifier having a pair of input terminals, a pair of second switches coupled between said second pair of sub-bit lines and the pair of input terminals of said third sense amplifier, a pair of third switches coupled between said pair of bus lines and the pair of input terminals of said third sense amplifier, first means for selectively enabling said pair of third switches in accordance with column address information, second means for operatively enabling said pair of first switches and said pair of second switches simultaneously only when said pair of third switches are enabled, third means for operatively enabling said first sense amplifier when said pair of third switches are not enabled and one of said first word lines is selected and enabling said second sense amplifier when said pair of third switches are not enabled and one of said second word lines is selected.

2. The memory device according to claim 1, further comprising an input/output circuit coupled to said pair of bus lines.

3. The memory device according to claim 1, in which each of said first and second sense amplifiers includes a pair of drive transistors having gates and drains cross-coupled at a pair of input terminals with sources commonly connected to a first node, first and second transistors connected in parallel between said first node and a control line, said first transistor being enabled by one of said first and second means, said second transistor being enabled by said third means.

4. A semiconductor memory device comprising;
a plurality of memory cells arranged in a matrix form of rows and columns, a plurality of word lines arranged in the rows and coupled to the memory cells, a plurality of bit line pairs each arranged in each of the columns, each of said bit line pairs including a pair of bit lines, a plurality of first sense amplifiers provided for the columns, each of said sense amplifiers having a pair of input terminals coupled to a pair of bit lines, a plurality of second sense amplifiers provided for the columns, each of said second sense amplifiers having a pair of input terminals, a pair of bus lines, a plurality of connecting means provided for the columns, each of said connecting means electrically connecting each pair of bit lines to the pair of input terminals of the associated second sense amplifier, a plurality of selection gate pairs coupled between said pair of bus lines and said plurality of bit line pairs, each of said selection gate pairs having a pair of selection gates connected between the pair of input terminals of the associated second sense amplifier and said pair of bus lines, a column decoder responsive to column address information for selectively enabling one of said selection gate pairs, a row decoder responsive to row address information for selecting one of said word lines, means for operatively enabling said first sense amplifiers simultaneously thereby to refresh data stored in the memory cells connected to the selected word line, and control means for selectively enabling only one of said second sense amplifiers, said one selected second sense amplifier being connected to said one enabled column selection gate pair, whereby data read out on said bit line pairs are refreshed by said first sense amplifiers simultaneously and said pair of bus lines are driven by the enabled one of said second sense amplifiers in accordance with data of the selected bit line pair.

5. The semiconductor memory device according to claim 4, in which each of said connecting means includes a pair of transfer gates connected between each pair of bit lines and the pair of input terminals of the associated second sense amplifier.

6. The semiconductor memory derive according to claim 4, further comprising a data input/output circuit coupled to said pair of bus lines.

* * * * *

UNITED STATES PATENT AND TRADEMARK OFFICE
CERTIFICATE OF CORRECTION

PATENT NO. : 4,875,193

DATED : October 17, 1989

INVENTOR(S) : Segawa

It is certified that error appears in the above-identified patent and that said Letters Patent is hereby corrected as shown below:

Column 4, lines 13 and 14, delete "DIA, DIA and DIB, DIB," and insert --DIA, $\overline{\text{DIA}}$ and DIB, $\overline{\text{DIB}}$--;

Column 4, lines 15, delete "and DIA" and insert --and $\overline{\text{DIA}}$--;

Column 4, line 20, delete "and DIB" and insert --and $\overline{\text{DIB}}$--;

Column 5, line 33, after "SAE" insert --$\overline{\text{SAE}}$--; and

Column 8, line 18, delete "derive" and insert --device--.

Signed and Sealed this

Thirteenth Day of November, 1990

Attest:

HARRY F. MANBECK, JR.

*Attesting Officer*  *Commissioner of Patents and Trademarks*